United States Patent [19]

Voss et al.

[11] Patent Number: 4,895,033

[45] Date of Patent: Jan. 23, 1990

[54] SAMPLE HOLDER FOR USE IN THE GRINDING OR POLISHING OF SAMPLES

[75] Inventors: Jørgen T. Voss, Charlottenlund; Asger P. Christensen, Herlev, both of Denmark

[73] Assignee: Struers A/S, Rødovre, Denmark

[21] Appl. No.: 303,135

[22] Filed: Jan. 30, 1989

Related U.S. Application Data

[62] Division of Ser. No. 135,455, Dec. 21, 1987.

[51] Int. Cl.$^4$ ............................................. G01N 1/32
[52] U.S. Cl. ................................. 73/864.91; 73/863; 51/216 H
[58] Field of Search ............ 73/865.9, 78, 63, 864.91, 73/864.41; 51/323, 216 H; 324/158 F, 73 PC; 29/829, 833, 835, 841, 848, 849

[56] References Cited

U.S. PATENT DOCUMENTS

| | | | |
|---|---|---|---|
| 3,684,960 | 8/1972 | Conley, Jr. et al. | 324/73 PC X |
| 4,510,446 | 4/1985 | Braun et al. | 324/73 PC X |
| 4,513,537 | 4/1985 | Spurling et al. | 51/119 X |
| 4,534,536 | 8/1985 | Nelson et al. | 249/83 |
| 4,579,313 | 4/1986 | Adani et al. | 249/83 X |
| 4,623,500 | 11/1986 | Nelson et al. | 356/244 X |
| 4,648,212 | 3/1987 | Dawson et al. | 51/165 R |
| 4,748,773 | 6/1988 | Dawson et al. | 51/165 R |
| 4,771,578 | 9/1988 | Jorgensen et al. | 51/118 X |
| 4,800,280 | 1/1989 | Satake | 250/339 |

Primary Examiner—Tom Noland
Attorney, Agent, or Firm—Watson, Cole, Grindle & Watson

[57] ABSTRACT

A plurality of fragments of printed circuit boards, so-called coupons, each having a row of plated-through holes to be examined and two reference holes, are mounted on positioning pins extending through the reference holes, and are then embedded in a molded block of a curable plastic material to form an independent multi-coupon sample with extending pin ends. A plurality of such samples are mounted in pockets of a sample holder so that their extending pin ends engage with hardened surface portions on the front face of the sample holder. The samples are then contacted by an abrasive element to remove material down to a cross-sectional level at a predetermined distance in front of the hardened surface portions. A jig can be used to cut out a coupon with reference holes from a circuit board. The sample holder includes a disc portion and a rim portion that are mutually angularly adjustable so as to simultaneously adjust a plurality of abrasion resistant stop screws of the sample holder in different positions for determining the termination of successive steps of abrasion.

2 Claims, 8 Drawing Sheets

SAMPLE HOLDER FOR USE IN THE GRINDING OR POLISHING OF SAMPLES

CROSS REFERENCE TO RELATED APPLICATION

This application is a division of application Ser. No. 135,455, filed December 21, 1987.

TECHNICAL FIELD OF THE INVENTION

The present invention relates to holders which can be used to mount multi-coupon samples when they are ground and/or polished for the purpose of inspecting the coupons therein.

BACKGROUND OF THE INVENTION

It is customary to subject the plated-through holes of printed circuit boards to a visual examination, preferably under a microscope, and along a diametrical cross-section through a row of holes. Since this is a destructive process, it is performed on a fragment of a circuit board, a so-called coupon. The coupon may be an appendage produced and plated-through together with the circuit board and subsequently broken off from the board for examination. Alternatively, the coupon may be cut out from a board, which is thereby destroyed. In that case, the coupon will be taken to be representative of a larger series of identical boards which have been subjected to the plating-through operation under identical conditions.

In either case, the coupon is so made that it has a row of holes to be examined located at a short distance from one longitudinal edge of the coupon. The row of holes to be examined has a common diametrical plane which forms a potential inspection face of the coupon. To expose this inspection face for the purpose of visual examination, material is removed from the relevant edge of the coupon and inwards to a depth such that the resulting cross-sectional inspection plane exactly coincides with the position of the common diametrical plane of the holes. This removal of material usually takes place by grinding, preferably in a plurality of steps, and is preferably followed up by at least one polishing step to smooth the metal surfaces to be examined under the microscope.

It is essential that the grinding depth should be controlled with very high precision, e.g., within tolerance limits of ±.05 mm. As a means of achieving this it is common practice to provide each coupon with two reference holes which are bored through the coupon adjacent its ends in positions such that the common diametrical plane of the reference holes is located at a predetermined accurate distance from the common diametrical plane of the row of holes to be examined. These reference holes may be used for the insertion of two hardened steel pins, referred to as positioning pins, by means of which the coupon may be held in correct position in the grinding and polishing steps. Preferably a plurality of coupons, e.g., six coupons, are mounted in a spaced side by side array on the same two positioning pins so as to form a set of coupons for joint handling in the examination procedure, the ends of the positioning pins extending beyond the outermost coupons of the set.

In a known method, a plurality of such sets of coupons are placed in respective mold cavities provided in the front face of a disc-shaped sample holder belonging to a grinding and polishing machine, in such a manner that the extending ends of the two positioning pins of each set of coupons extend beyond the circumference of the respective cavity and are supported against the front face of the disc. A curable plastic material, such as acrylic resin, is poured into the cavities to embed the coupons and anchor them with the positioning pins in firm contact with the front face of the disc, whereby the samples so formed have the plated-through holes of all their constituent coupons located at a precise distance in front of the front face of the disc. The sample holder is provided with axially-extending adjustable stop screws having hardened end portions, e.g., consisting of tungsten carbide, resistant to the action of a grinding face. By adjusting the stop screws such that their ends project to a predetermined distance from the front face of the disc, the large number of coupons comprised by the plurality of sets of coupons may simultaneously be ground down to the same cross-sectional level as related to the positioning pins. If more than one grinding step is to be performed, e.g., a rough grinding and a fine grinding operation, the stop screws must each time be re-adjusted to a smaller distance from the front face of the disc, and in the final grinding step this distance should be exactly equal to the radius of the positioning pins plus the distance between the diametrical plane of the reference holes and the diametrical plane of the row of holes to be examined. If the grinding steps are to be followed up by one or more polishing steps, the stop screws must again be re-adjusted in order to retract them so that they will not engage the polishing face.

While satisfactory results may be obtained with this known method if carried out with great skill and care, it is a disadvantage that the sample holder is unavailable for active use during the relatively long time interval, e.g., $\frac{1}{2}$-1 hour, required for the curing of the plastic material used for embedding, considering that the actual processing time for grinding and polishing amounts to just a few minutes. In large scale processing, it will therefore be necessary to have a large number of interchangeable sample holders available for use. It is also a disadvantage that a plurality of stop screws have to be adjusted and checked for accuracy before the commencement of each grinding step. Both of the factors mentioned tend to reduce the productivity of both the grinding machine and the operators.

SUMMARY OF THE INVENTION

It is an object of the invention to provide a sample holder by means of which the adjustment of hardened stops to define the grinding depth, both initially and in between grinding steps, is greatly facilitated in such a manner as to obtain a very great accuracy of adjustment and re-adjustment in a minimum of time.

DESCRIPTION OF A METHOD OF MAKING MULTI-COUPON SAMPLES

The terms "front" and "rear", as used herein, are intended to refer to the orientation of elements towards and away from the grinding and polishing faces of a grinding and polishing machine in the last processing step. Thus, e.g., a "front view" of an element will refer to a view of the front end or side of the element, or in other words a view taken in the rearward direction.

Figure 1:
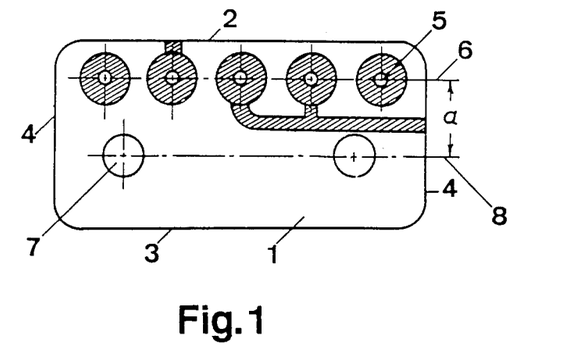
FIG. 1 is an enlarged plan view of a coupon to be used for the examination of plated-through holes of a printed circuit board to which the coupon belongs.

The coupon 1 shown in FIG. 1 is a substantially rectangular, flat element having a front longitudinal edge 2, a rear longitudinal edge 3, and transverse lateral edges 4,4. The coupon has a row of plated-through holes 5, the common diametrical plane of which is denoted by reference character 6. The row of holes 5 is located at a small distance from the front edge 2. Two reference holes 7 are provided in the coupon rearwards of the holes 5 in positions such that their common diametrical plane 8 is located at a predetermined distance a from the common diametrical plane 6 of the plated-through holes 5. In making the reference holes it is essential that the measure of the distance a should be kept within very narrow tolerance limits, e.g. ±.05 mm.

While the coupons to be examined by the method according to the parent application Ser. No. 135,455 may be provided in any conventional manner and may have rounded corners, as illustrated in FIG. 1, or square corners, and may be in the form of broken-off appendage coupons or cut-out coupons, as earlier described, a preferred method of providing coupons for the examination of plated-through holes will now be described with reference to the coupon-making device illustrated in FIGS. 2-4.

Figure 2:
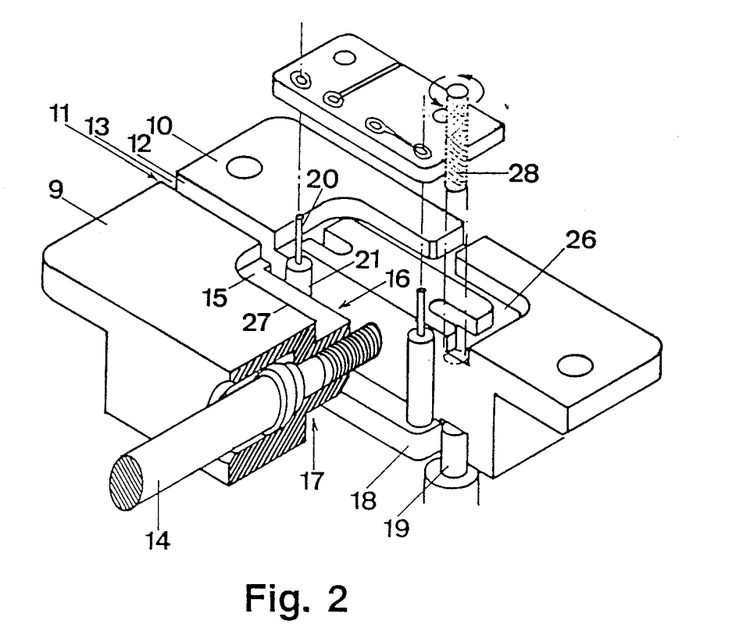
FIG. 2 is a diagrammatic, partly fragmentary illustration of a device that may be used for cutting out coupons as that of FIG. 1 from printed circuit boards, the illustration being a perspective view at an inclination from above.
Figure 3:
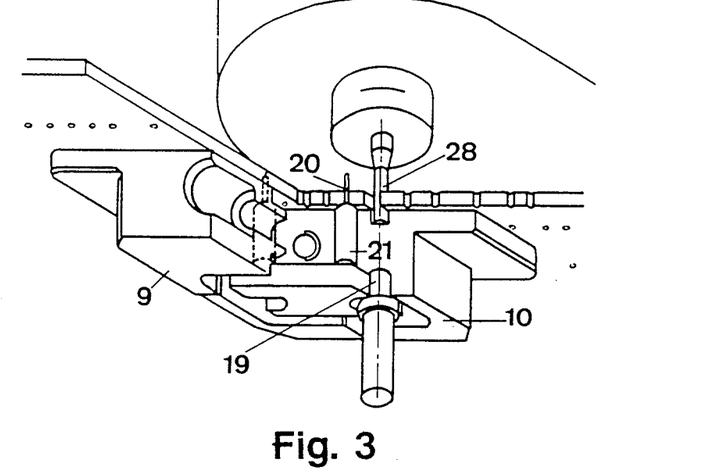
FIG. 3 is a diagrammatic, partly fragmentary perspective view of the device of FIG. 2 at an inclination from below.
Figure 4:
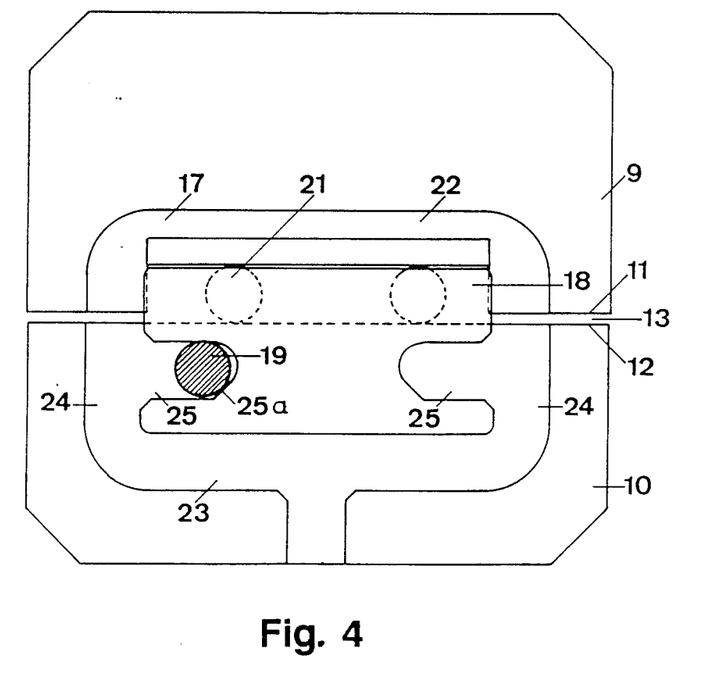
FIG. 4 is a bottom view of a jig forming part of the device of FIGS. 2 and 3.

The device of FIGS. 2-4 comprises a jig 9,10 consisting of a front part 9 and a rear part 10 having opposed faces 11 and 12, respectively, between which a clamping slot 13 is formed, the two parts being connected by means of a clamping screw 14, which is shown in FIG. 2 but omitted in FIGS. 3 and 4. The right half of the front part 9 is cut away in FIGS. 2 and 3.

Adjoining the clamping slot 13, the front part 9 of the jig is constructed with a top recess 15, a facial recess 16 and a bottom recess 17. The rear part 10 of the jig has a plane face 12, but is constructed at its bottom with a protruding flange 18 which matches with the bottom recess 17 of the front part 9 of the jig.

The jig is freely supported on a table (not shown) which is provided with an upwardly-extending guide pin 19 which engages a guide track formed in the bottom face of the jig, as will later be explained.

When the jig is to be used for cutting out a coupon with reference holes from a circuit board, a positioning needle 20 is inserted into each of two plated-through holes in a row of such holes in the board. The positioning needles should fit snugly in the holes. The operator therefore preferably has a selection of positioning needles of varying diameter at his disposal. All positioning needles are constructed with a shank 21, the diameter of which has a predetermined value within the same narrow tolerance limits as those applying to the distance a in FIG. 1. When the two positioning needles 20 have been inserted, the circuit board is placed on top of the jig with the shanks 21 depending into the interspace between the plane face 12 of the rear part 10 of the jig and the recess 16 in the face 11 of the front part 9 of the jig, and the clamping screw 14 is turned to firmly clamp the shanks 21 between the face 12 and the bottom of the recess 16. Thereby, the circuit board is accurately positioned relative to the jig. If desired, means (not shown) may be provided for additionally clamping the circuit board against the upper face of the jig, after it has been positioned as described.

Reference will now be made to FIG. 4, which shows a bottom view of the jig in the position in which the shanks 21 of the positioning needles 20 have been clamped between the parts of the jig as above described. As will be seen, a guide track is formed in the bottom face of the jig, comprising a front run 22, a rear run 23, two lateral runs 24, and two blind runs or notches 25 extending inwardly from the lateral runs 24 parallel to the front and rear, runs 22, 23. The rear run 23, the major portions of the lateral runs 24, and the blind runs 25 are machined in the bottom face of the rear part 9 of the jig, while the front run 22 and the remaining portions of the lateral runs 24 are formed between the flange 18 of the rear part 9 and the wall of the recess 17 of the front part 9 of the jig. The inner contour of the round-going track 22-24 defines the contour of the coupon to be cut out from the circuit board, while the inner ends of the notches 25 define the positions in which the reference holes are to be drilled. Since the guide pin 19 must have some transverse play in the guide track, it is important that the guide pin, when urged by the operator towards the ends of the notches 25, should be caused to assume a position in which its axis is located precisely at the distance a, FIG. 1, from the diametrical plane of the shanks 21 clamped between the jig parts. In the embodiment shown this is obtained by constructing the rear wall of each notch adjacent the end of the notch with a ramp 25a for forcing the guide pin 19 into contact with the front wall of the notch 25. The correct position of a reference hole drilled along the prolonged axis of the guide pin 19, as will be described later, relative to the diametrical plane of the shanks 21, representing that of the plated-through holes, is then obtained if the jig is so constructed that the distance from the front wall of each of the notches to the face 12 of the jig part 10 is exactly equal to the distance a minus the radius of the guide pin 19 minus the radius of a shaft 21. The other dimensions of the guide track are not critical, since accuracy of the outer configuration of the coupon is not required.

In the top face of the jig, a clearance track 26 is provided which has the same general configuration as the guide track in the bottom face, with the exception that the whole area between the outer contour line 27, corresponding to that of the front run 22 at the bottom, and the clamping slot 13 is recessed, viz. formed by the recess 15, so that the front run and small portions of the lateral runs of the clearance track have no inner contour line. This is of no avail, seeing that the purpose of the clearance track is not to guide movement of the jig, but to provide clearance for a tool piercing the circuit board from above in any position permitted by the guide track in the bottom face of the jig.

Such a tool is shown at 28. It is a combined drilling and routing tool, which is located above the jig in a vertical line exactly coinciding with the axis of the guide pin 19. It can be activated and lowered and raised under the control of an operator, e.g., by pressing and releasing a pedal. The necessary control system is not disclosed herein, but can be constructed in a multitude of ways well-known to a man skilled in the art.

The operation of the coupon-making device is as follows:

After a circuit board has been placed on top of the jig and has been clamped in position as described, the jig is moved by hand to a position where the guide pin 19, relatively travelling in the guide track 22–25, has reached a position in firm contact with the end of one of the notches 25 as explained above. The tool 28 is then activated and lowered to drill a first reference hole. The tool is raised, and the same process is repeated to drill a second reference hole. Upon renewed raising of the tool 28, the jig is moved to cause the guide pin 19 to travel from the end of the second notch out into the contour track formed by the runs 22–24. The tool 28 is then again activated to pierce the circuit board and while the tool is being held in this activated position, the jig is moved so as to cause the guide pin 19 to travel all the way round the contour track, whereby a coupon with reference holes in correct positions is cut out from the printed board. The clamping screw 14 is loosened, and the coupon and the board are removed from the jig. The positioning needles 20 with their shanks 21 are pulled out of the plated-through holes and are then ready for renewed use.

It has been found that the guided moving around of the jig to correct positions for drilling and in a correct (but not critical) path for routing can be performed very quickly without the exercise of particular skill, since the strict observance of the critical measures mentioned above ensures precision of the location of the reference holes relative to the diametrical plane of the row of through-plated holes to be examined.

Figure 5:
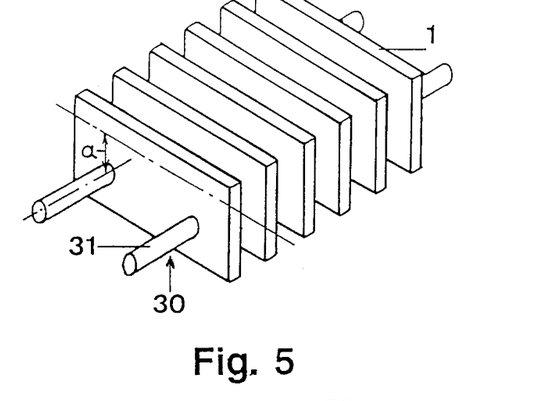
FIG. 5 is a perspective view of a set of coupons mounted on two positioning pins.
Figure 6:
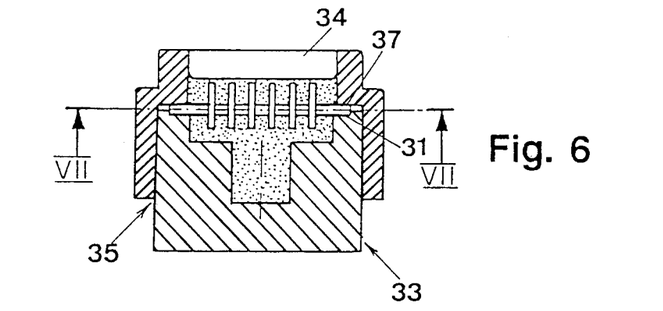
FIG. 6 is a vertical longitudinal section through a bi-partite mould for use in molding a set of mounted coupons like that in FIG. 4 into a block of curable plastic material.
Figure 7:
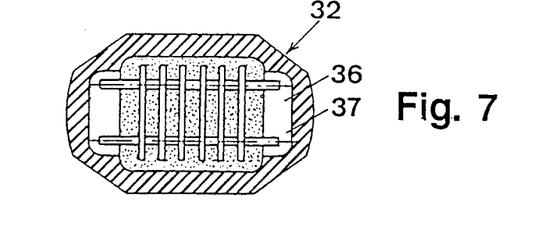
FIG. 7 is a section along the line VII-VII in FIG. 6.
Figure 8:
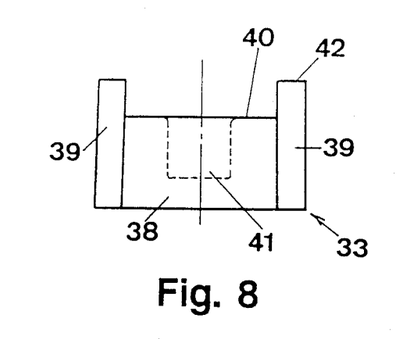
FIG. 8 is a side view of the rear part of the mold of FIGS. 6 and 7.
Figure 9:
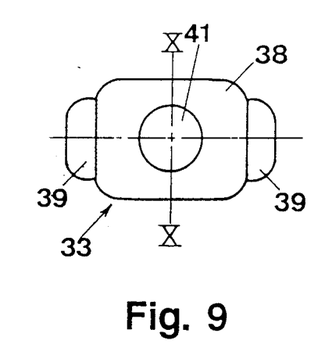
FIG. 9 is a top view of same.

In the next step of the procedure, a plurality of coupons, whether made by means of the device of FIGS. 2–4 or in any other suitable manner, are mounted in a spaced side-by-side arrangement on two hardened steel pins 30, cf. FIG. 5, by pressing the pins 30 through the reference holes 7 of the coupons with a tight fit in such a manner that end portions 31 of the pins extend beyond the outer surfaces of the outermost coupons. It will be realized that the distance between the common diametrical plane of the row of plated-through holes of all the coupons and the common diametrical plane of the two positioning pins 30 is exactly equal to the distance a in FIG. 1.

The pin-supported set of coupons illustrated in FIG. 5 is embedded in a molded block of curable plastic material to be used as a sample in a grinding and polishing operation.

A suitable form of mold for carrying out the molding process is illustrated in FIGS. 6–9. The mold comprises a front part 32 made from a relatively hard material, e.g., a hard plastic material, and a rear part 33 made from a relatively soft material, e.g., an elastomeric material or rubber. The front part 32 has an open front cavity 34 of a cross-sectional shape ample to receive a pin-mounted set of coupons like that in FIG. 5 with the exception of the end portions 31 of the pins 30, and an open rear cavity 35 having the same cross-sectional shape supplemented by narrowed, rounded channel areas 36 at the ends of the cross section, forming channels extending in the full length of the rear cavity. At the transition between the front and rear cavities landing faces 37 for the engagement of the pin end portions 31 are formed.

The rear part 33 is formed as a plug snugly fitting in the rear cavity 35 of the upper part 32. It has a main body 38 of the same cross-sectional shape as the front cavity of the upper part 32, and column portions 39 fitting in the channels 36 of the upper part, and extending above the top surface 40 of the main body 38. In the top surface 40, a cylindrical mold cavity 41 is provided.

To make an embedded sample from the pin-mounted set of coupons of FIG. 5, the latter is introduced, pins rearwards, into the front part 32 from the rear end thereof in such a manner as to engage the pin ends 31 with the landing faces 37. Thereafter the rear part 33 is introduced into the rear cavity 35 of the front part 32 at such a pressure that the pin ends 31 are firmly clamped between the landing faces 37 and the upper faces 42 of the column portions 39 of the rear part 33.

The mold is now placed with the front part up and, while maintaining the pin ends firmly clamped, if necessary using special clamping means (not shown), molding material is poured into the mold until the upper marginal portions of the coupons have been covered. The molding material is left to cure, and thereafter the mold parts are separated, and the molded block is removed.

Since the rear part 33 consists of soft, elastic material, it can easily be stripped off the molded block. If the block sticks in the upper part, it can be loosened by lightly tapping the front end of the block. Alternatively, the block may be loosened from the upper part by gently twisting the rear part back and forth a few times, before it is stripped off the block.

Figures 10, 11:
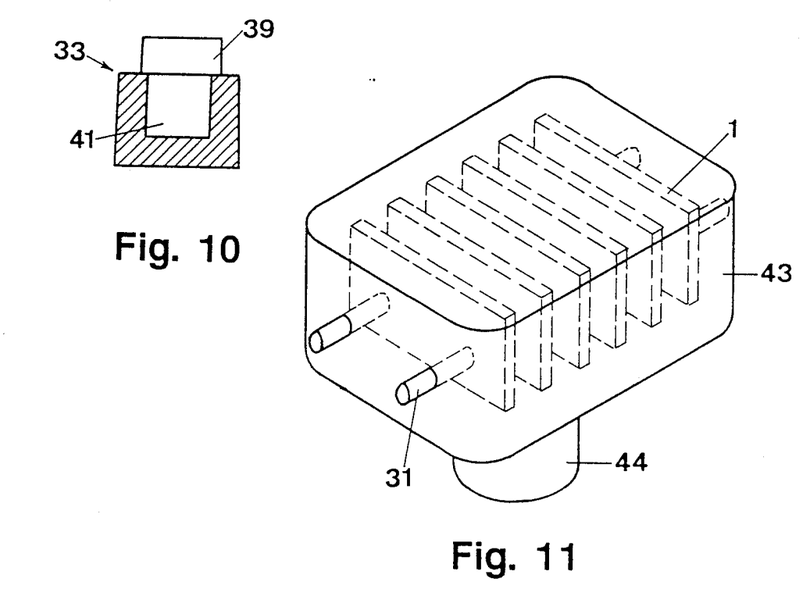
FIG. 10 is a section along the line X-X in FIG. 9.
FIG. 11 is an enlarged perspective view of a molded block with an embedded set of pin-mounted coupons, ready for being received and mounted as a sample in a sample holder of a grinding and polishing machine.
Figure 12:
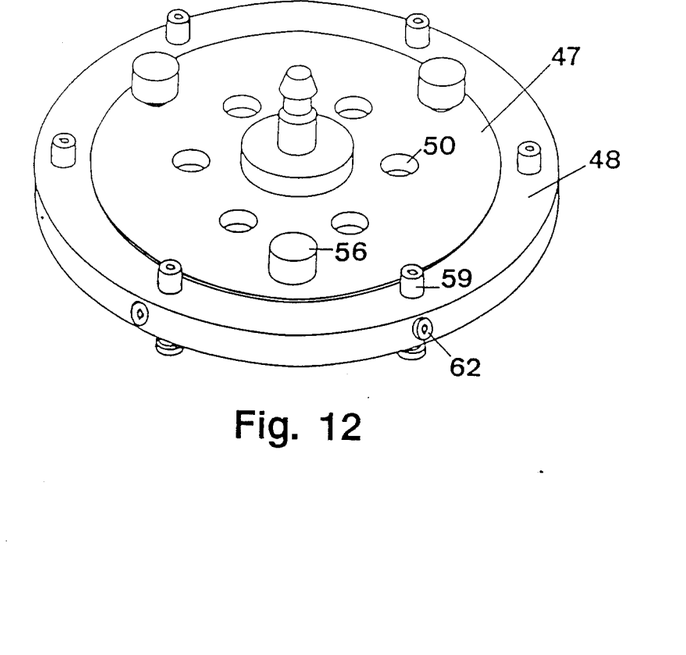
FIG. 12 is a perspective view at an inclination from the rear of a sample holder with pockets for receiving a plurality of samples like that shown in FIG. 11.

A block produced in the manner described is illustrated in FIG. 11. It has a main body 43, in which the coupons 1 are embedded with the end portions 31 of the pins 30 extending out of the main body, and a cylindrical shank portion 44 formed in the mold cavity 41.

It will be realized that, since the pin ends 31 are pressed firmly against the landing faces 37 of the hard front part of the mold during the whole of the molding process, their frontmost circumferential areas lie exactly in a common plane. The same will therefore apply to the axes of the pins and to the rearmost circumferential areas of the pin ends. Moreover, since the latter areas are firmly engaged by the soft elastic material of the rear part of the mold, certainty exists that the rearmost circumferential areas of the pin ends will be nude, i.e., free from molding material. This is important, because these areas determine the axial position of the sample in the subsequent grinding and polishing operations, as will later be explained.

Figure 17:
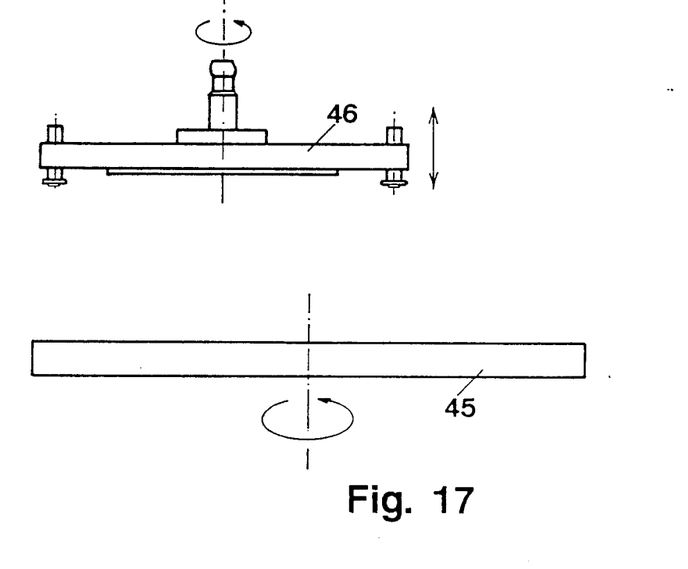
FIG. 17 is a diagrammatic side view of a grinding and polishing machine.

The grinding and polishing operations may be performed by means of a conventional grinding and polishing machine, which should however be provided with a special sample holder according to the present invention. The general construction of such a machine is illustrated in FIG. 17. A working disc 45 and a sample holder 46 are mounted for rotation about mutually eccentric vertical axes. Samples to be ground or polished can be mounted in the sample holder 46 so as to protrude from its lower faces. Abrasive sheets, such as grinding paper of various degrees of roughness, and polishing cloths of various grain size, can be fastened to the upper face of the working disc, preferably by means of a self-adhesive backing, thereby providing grinding and polishing faces. The sample holder can be urged towards the working disc, and retracted therefrom. For such a machine the front or forward direction, as previously defined, will be downwards.

DESCRIPTION OF A PREFERRED EMBODIMENT OF THE INVENTION

A preferred embodiment of a sample holder according to the invention will now be described with reference to FIGS. 12–16.

The sample holder comprises a disc portion 47 and a rim portion 48 connected with the disc portion for angular adjustment relative thereto. In the front face of the disc 47, a plurality of (in the example illustrated six) sample-receiving pockets 49 are provided, which are uniformly distributed in the circumferential direction. Each pocket 49 has a cross-sectional shape matching that of the main body 43 of a multi-coupon sample as the one shown in FIG. 11, and in the bottom of the pocket a cylindrical through-hole 50 is provided matching the shank portion 44 of the sample.

At a small distance from each end of each pocket an elongated insert 51 of hard metal, such as tungsten carbide, is in-laid in the front face of the disc, extending parallel to the edge of the pocket and protruding slightly from the front face of the disc. When these inserts have been placed in corresponding shallow recesses in the front face of the disc and fastened therein, e.g., by means of an adhesive, they are subjected to a diamond grinding operation, whereby their front surfaces, forming hardened portions of the front face of the disc, will define a front supporting plane, which is exactly perpendicular to the axis of the sample holder. Owing to the hardness and wear resistance of the inserts, they will be resistant to scratching and moderate impacts and blows, to which they may accidentally be subjected in the handling of the sample holder, and will also be unaffected by the local contact pressure to which they are subjected during use.

Figure 13:
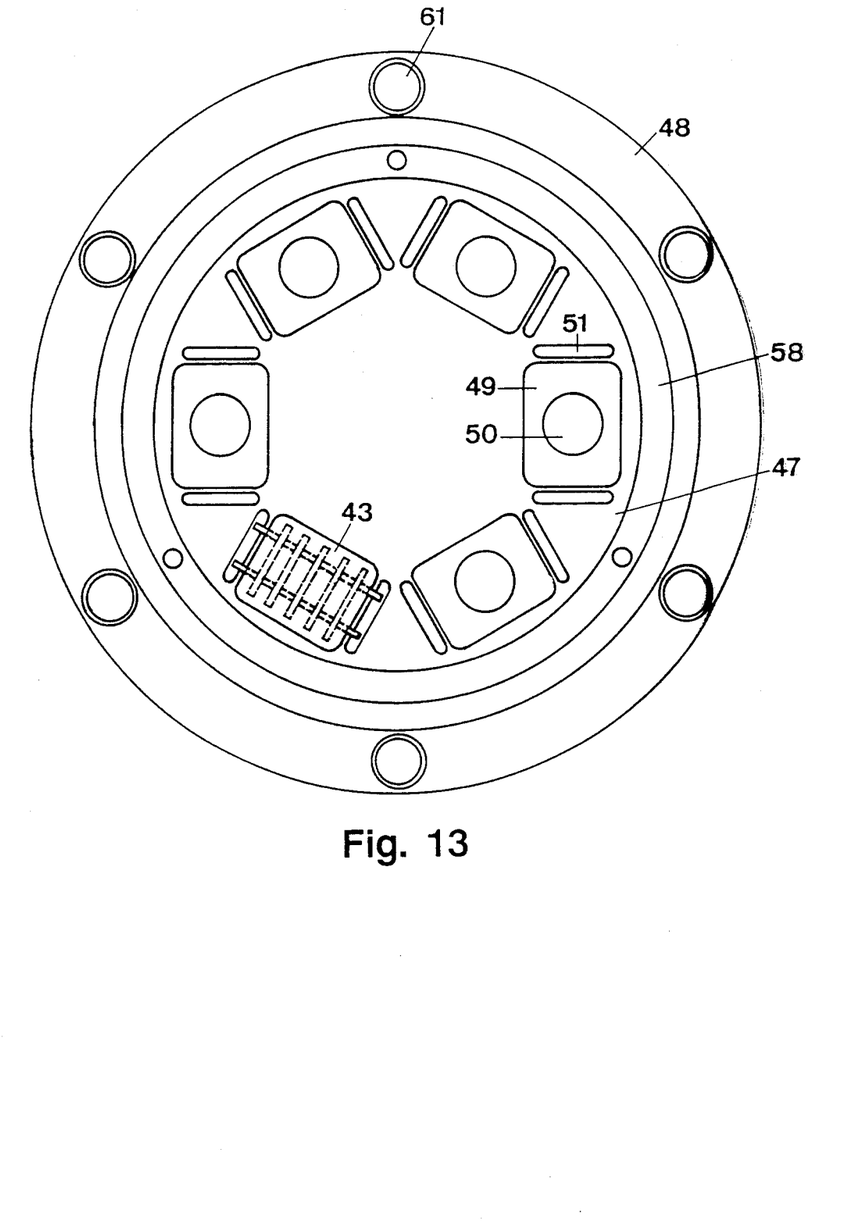
FIG. 13 is a front view of the sample holder of FIG. 12 with a sample placed in one of the pockets.
Figure 14:
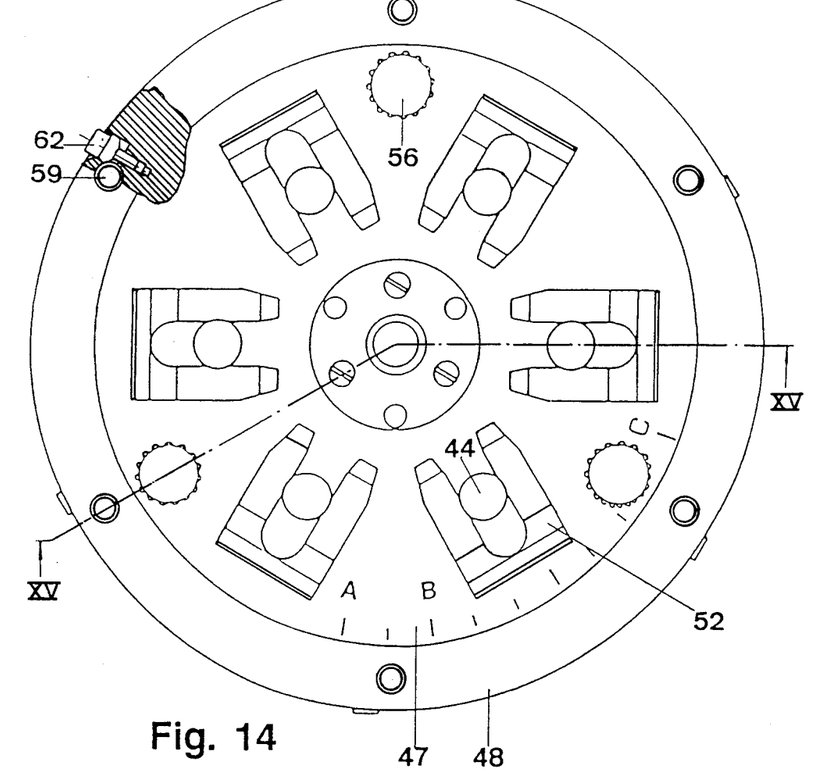
FIG. 14 is a rear view of the sample holder of FIGS. 12 and 13 with samples placed in the pockets and held in position therein by means of spring clips.
Figure 15:
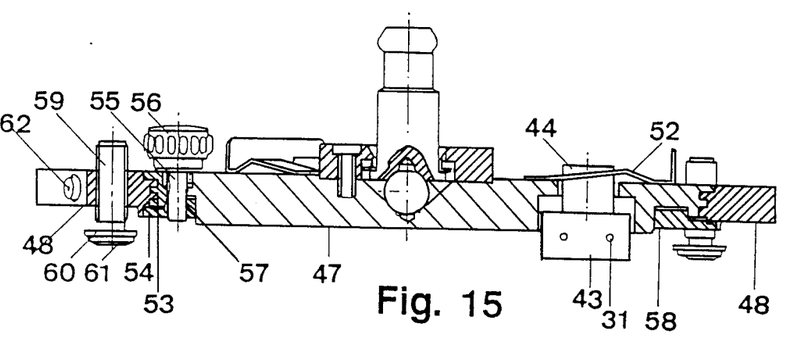
FIG. 15 is a section along the broken line XV—XV in FIG. 14.
Figure 16:
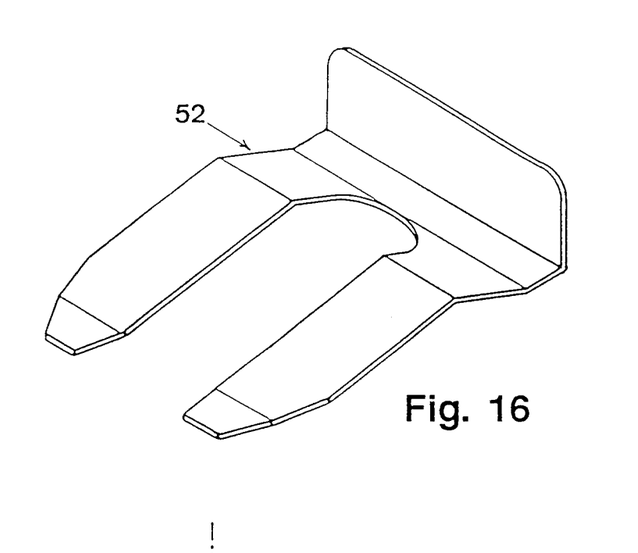
FIG. 16 is an enlarged perspective view of a spring clip used for holding samples like those of FIG. 11 in position for grinding and polishing in the pockets of the sample holder of FIGS. 12-15.

Preparatory to the grinding and polishing operations, multi-coupon samples like that in FIG. 11 are loaded into all the sample pockets 49 or some of them (at least three) and are pushed inwards, until their extending pin ends 31 are engaged with the inserts 51, as illustrated in FIG. 13 for one of the sample pockets. At this point, the shank portions 44 will extend through the holes 50 to project from the rear face of the disc 47, and bifurcated spring clips 52 are now placed near the circumference of the disc 47 and slid inwards to engage the shanks 44 and urge them rearwards, thereby to consolidate the engagement of the pin ends 31 with the inserts 51 and to maintain the samples in position when not engaged by grinding or polishing faces. During the grinding or polishing steps the grinding or polishing pressure will further urge the pin ends 31 against the inserts 51, and it will therefore be realized that during these operations the common diametrical plane of the plated-through holes of all the coupons of all the samples will be located at a distance from the front supporting plane of the disc, as previously defined, exactly equal to the distance a in FIG. 1 plus the radius of the positioning pins 30.

The disc portion 47 and the rim portion 48 of the sample holder 46 are threadedly engaged with one another by means of an outer screw thread 53 on the disc portion 47 and an inner screw thread 54 on the rim portion 48. Thus, by relative angular adjustment of the two portions, the rim portion 48 will be axially displaced relatively to the disc portion 47. Markings A, B, C and intermediate scale markings are provided to indicate selected positions of relative angular adjustment of the disc portion 47 and the rim portion 48.

The screw threads 53 and 54 of the disc portion 47 and the rim portion 48 interengage at a sufficient clearance to permit convenient angular adjustment by hand. However, the two portions can be arrested in any position of relative angular adjustment by means of manually operated arresting screws 55 having fluted heads 56 on the rear side of the disc portion 47 and a screw thread 57 engaging threaded holes of an arresting ring 58 engaging the front face of the rim portion 48. By tightening the arresting screws 55 by hand, the rear flanks of the screw thread 54 of the rim portion 48 are axially urged against the contiguous front flanks of the screw thread 53 of the disc portion, whereby the disc portion and the rim portion are locked against mutual rotation.

The rim portion 48 is provided with a plurality of (e.g. six) stop screws 59 extending in the forward direction and being constructed at their forward ends with heads 60 having surface portions 61 hard enough to resist the abrasive action of a grinding face. As an example, the surface portions 61 may consist of tungsten carbide (WC). The stop screws 59 may be locked in a selected position by means of transverse locking screws 62 having polygonal holes for the engagement of a L- or T-key.

Before the sample holder is taken into use the stop screws 59 are calibrated in the following manner: The rim portion 48 is adjusted in the relative angular position corresponding to the marking B and is arrested in this position by tightening the arresting screws 53. Each stop screw is now turned to a position in which the axial distance between its front surface portion 61 and the front supporting plane defined by the front surfaces of the inserts 51 is exactly equal to the distance a in FIG. 1 plus the radius of the positioning pins 30, whereafter the respective locking screw 62 is tightened by means of the L- or T-key. In performing this calibration, a dial gauge may be used in a manner known per se.

After the calibration of the stop screws 59 has been performed, the sample holder can be used for a large number of grinding and polishing operations, just requiring watching of the calibration from time to time, and restoration as required.

The grinding and polishing operations are performed as follows:

After the sample holder has been loaded with multi-coupon samples, the rim portion 48 is adjusted at marking A, and is locked in this position by tightening the arresting screws 55. A piece of rough grinding paper is placed on the working disc 45, and the sample holder is lowered to working position and urged against the grinding face formed by the grinding paper at a suitable grinding pressure. This pressure is maintained until the front surface portions 61 of the calibrated stop screws are engaged by the grinding face. If this does not occur within a reasonable time interval, the sample holder may be temporarily raised to replace the worn-out grinding paper by a fresh grinding paper, whereafter grinding is resumed.

Marking A has been so selected that when the stop screws are eventually engaged by the grinding face, the multi-coupon samples have been ground down to a cross-sectional level slightly in front of the common diametrical plane of all the plated-through holes of all the coupons of all the samples.

The sample holder is now raised and readjusted at marking B, and a fine grinding paper is placed on the working disc instead of the rough grinding paper, whereafter the sample holder is again lowered and urged against the new grinding face at a suitable grinding pressure, which may be lower than that in the rough grinding stage, until the calibrated stop screws are engaged by the grinding face. From the above description of the calibrating procedure it will be realized that the multi-coupon samples have now been ground down to a cross-sectional level exactly coinciding with the common diametrical plane of all the through-plated holes of all the coupons, amounting in the example to a total of 6×6×6=216 holes.

It is often desirable to smooth the exposed metal surfaces of the plating-through material to be inspected under the microscope. In that case the sample holder is adjusted at marking C, and a polishing cloth is placed on the working disc 45. At marking C the rim portion 48 with the stop screws 59 is in a so retracted position that the stop screws will not engage the delicate polishing cloth, so the polishing can be continued for as long a time interval as deemed necessary, usually between 2 minutes for "rough polishing" to 20 seconds for "fine polishing". The amount of material removed in the polishing operation is so small that it does not perceptibly change the location of the exposed cross-sections through the plated-through holes.

In the manner described it is possible to perform any number of grinding and polishing steps, and at any stage of the procedure, the operation in progress may be stopped, and the multi-coupon samples may be individually removed from the sample holder for inspection, and may then be re-inserted into the sample holder without loss of precision. Similarly, after the grinding and polishing procedure has been completed, the samples may be taken out individually for examination under the microscope, instead of placing the whole sample holder in position for successive examination of the samples.

After the samples have been removed from the sample holder, the sample holder is immediately ready for receiving a new load of samples, which have been made and cured by the molding procedure described with reference to FIGS. 5-11.

It will be recalled that in each position of mutual angular adjustment of the rim portion 48 and the disc portion 47 of the sample holder, the precision of the mutual axial positions of the two portions is contingent on the fact that a set of contiguous flanks of the screw threads 53 and 54 are axially engaged with each other at a pressure produced by the tightening of the arresting screws 55 - and subsequently increased by the grinding pressure, when a grinding operation is taking place. Thus, the contiguous flanks constitute opposed contact faces which are axially urged together to define the mutual axial positions of the rim portion 48 and the disc portion 47. Seeing that only a limited number of positions of mutual angular adjustment are required, it is not essential that the opposed contact faces should be helical, and the screw threads may therefore be replaced by other forms of opposed faces which, when axially engaged with one another, define different distances between the front supporting plane of the disc portion 47 and the forward ends 61 of the calibrated stops 59,60 in different positions of angular adjustment of the disc portion 47 and the rim portion 48. Thus, the opposed faces could be of circumferentially stepped configuration instead of helical configuration.

We claim:

1. A sample holder for use in the grinding or polishing of samples for the purpose of producing exposed smooth inspection faces on said samples at a predetermined cross-sectional location thereof, said sample holder comprising a disc portion having a front face constructed to define a front supporting plane perpendicular to a central axis of the disc portion, a rim portion connected with said disc portion for angular adjustment relatively thereto, said disc portion having a plurality of sample holding means for holding samples in such a manner as to protrude from said disc portion such as to have their potential inspection faces located at a predetermined distance from said front supporting plane, said rim portion being provided with a plurality of calibrated stops extending in a forward direction and being constructed at their forward ends with surface portions hard enough to resist the abrasive action of a grinding face, said disc portion and said rim portion having opposed contact faces adapted to be axially engaged with one another and, when so engaged, to define different distances between the front supporting plane of said disc portion and the forward ends of said calibrated stops in different positions of angular adjustment of said disc portion and said rim portion, manually operable means operative between said disc portion and said rim portion for urging said opposed contact faces into firm axial engagement with one another and for loosening such engagement to permit relative angular adjustment of said disc portion and said rim portion, markings being provided to indicate selected positions of relative angular adjustment of said disc portion and said rim portion.

2. A sample holder as in claim 1, in which said disc portion and said rim portion are connected by means of screw threads interengaging at a clearance and forming the angularly adjustable connection between the portions, said opposed contact faces being constituted by one set of contiguous flanks of said screw threads.

* * * * *